(12) United States Patent
Burrows et al.

(10) Patent No.: US 9,318,536 B2
(45) Date of Patent: Apr. 19, 2016

(54) LIGHT EMITTERS WITH SERIES CONNECTION

(75) Inventors: Paul E. Burrows, Ewing, NJ (US); Ruiqing Ma, Ewing, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 0 days.

(21) Appl. No.: 14/237,495

(22) PCT Filed: Aug. 9, 2011

(86) PCT No.: PCT/US2011/047075
§ 371 (c)(1),
(2), (4) Date: May 28, 2014

(87) PCT Pub. No.: WO2013/022434
PCT Pub. Date: Feb. 14, 2013

(65) Prior Publication Data
US 2014/0374709 A1  Dec. 25, 2014

(51) Int. Cl.
*H01L 27/32* (2006.01)
*H05B 33/08* (2006.01)

(52) U.S. Cl.
CPC ........ *H01L 27/3204* (2013.01); *H01L 27/3202* (2013.01); *H05B 33/0896* (2013.01); *H01L 2251/5361* (2013.01)

(58) Field of Classification Search
CPC ............ H01L 27/3204; H01L 27/3202; H01L 2251/5361; H05B 33/0896
See application file for complete search history.

(56) References Cited

U.S. PATENT DOCUMENTS

| | | | |
|---|---|---|---|
| 2004/0021425 A1* | 2/2004 | Foust et al. | 315/169.3 |
| 2004/0032220 A1* | 2/2004 | Cok et al. | 315/291 |
| 2007/0121321 A1* | 5/2007 | Cheng | 362/252 |
| 2008/0130284 A1* | 6/2008 | Altamura et al. | 362/251 |
| 2009/0122535 A1* | 5/2009 | Niedermeier | 362/234 |
| 2010/0134041 A1* | 6/2010 | Radermacher et al. | 315/294 |

* cited by examiner

*Primary Examiner* — Roy Potter
*Assistant Examiner* — Paul Patton
(74) *Attorney, Agent, or Firm* — Morris & Kamlay LLP

(57) ABSTRACT

An organic solid state lighting system comprising multiple OLED modules connected in series is provided.

18 Claims, 7 Drawing Sheets

LIGHT EMITTERS WITH SERIES CONNECTION

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs). More specifically, the invention pertains to an organic solid state lighting system comprising multiple OLED modules connected in series.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

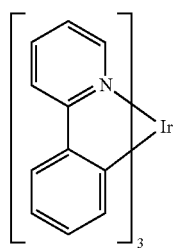

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

A first device comprising a plurality of light emitting modules is provided. Each light emitting module comprises at least one OLED and the plurality of light emitting modules are electrically connected in series.

In one aspect, the first device is a luminaire.

In one aspect, the first device includes at least one receptacle designed to receive at least one light emitting module. The first device also includes at least one bypass switch which bypasses at least one module when the module is open circuit. In another aspect, bypass switch is mechanical. In yet another aspect, bypass switch is electrical. In a further aspect, bypass switch is a transistor circuit.

In one aspect, the first device includes at least one receptacle designed to receive at least one light emitting module. The receptacle includes a bypass switch which bypasses the receptacle when the module is unplugged.

In another aspect, each light emitting module further comprises a positive contact and a negative contact and the receptacle includes a pair of electrical connectors adapted to electrically connect to the positive and negative contacts of one of the plurality of the light emitting modules. The bypass switch is electrically connected between the pair of electrical connectors, and the bypass switch is adapted to be open when the module is plugged into the receptacle, and to be closed when the module is unplugged.

In one aspect, each OLED has an anode and a cathode. The positive contact is connected to at least one OLED anode, and the negative contact is connected to at least one OLED cathode.

In one aspect, each light emitting module includes exactly one OLED. In another aspect, each light emitting module includes a plurality of OLEDs. For devices in which each light emitting module includes a plurality of OLEDs, at least one light emitting module may include a plurality of OLEDs connected in series. Alternatively, at least one light emitting module may include a plurality of OLEDs connected in parallel. Moreover, at least one light emitting module may include a plurality of OLEDs connected in a combination of series and parallel.

In one aspect, the light emitting module contains an aperture through which light can pass. In another aspect, the light emitting module is opaque.

In one aspect, the module may comprise an encapsulated OLED.

BRIEF DESCRIPTION OF THE DRAWINGS

FIG. 5A shows the bypass switch is open when the light emitting module is plugged into the receptacle. FIG. 5B shows the bypass switch is closed when the light emitting module is unplugged from the receptacle.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
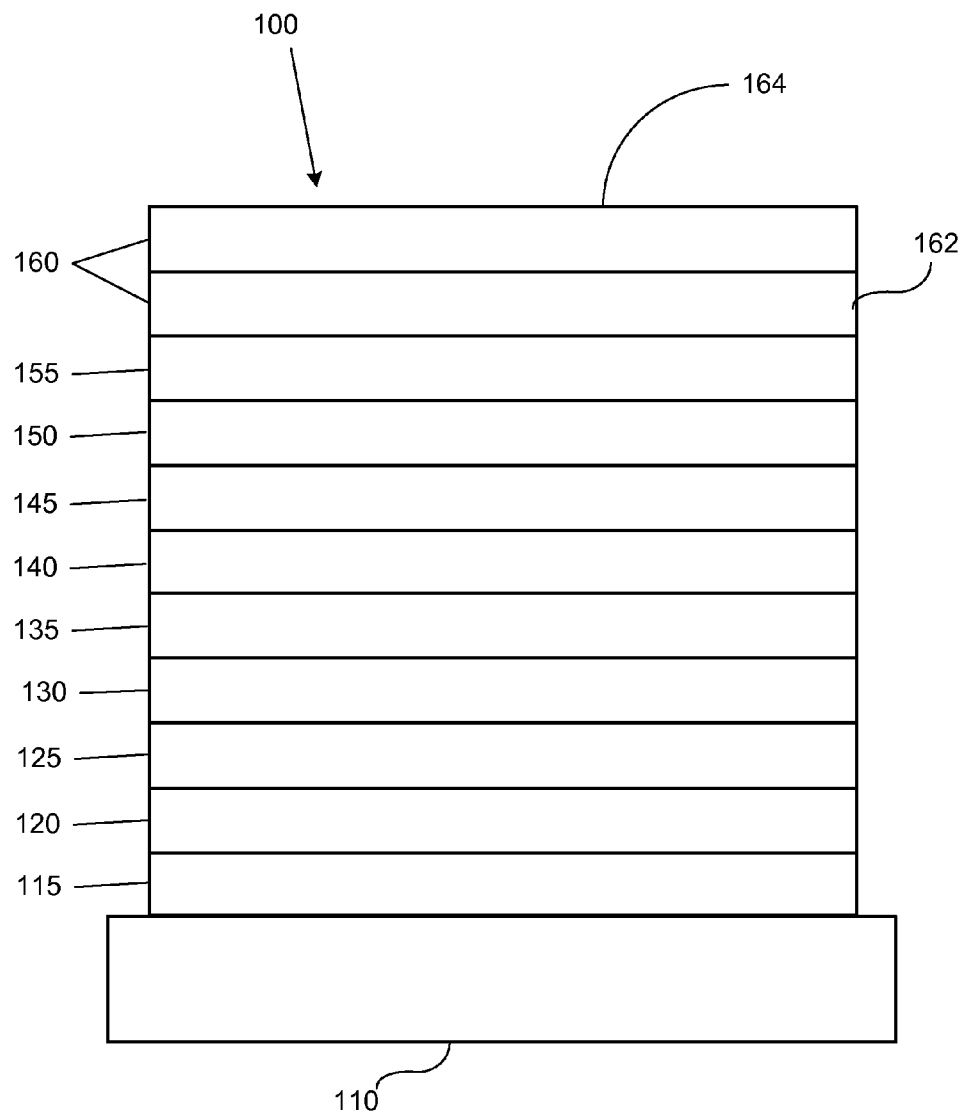
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279, 704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
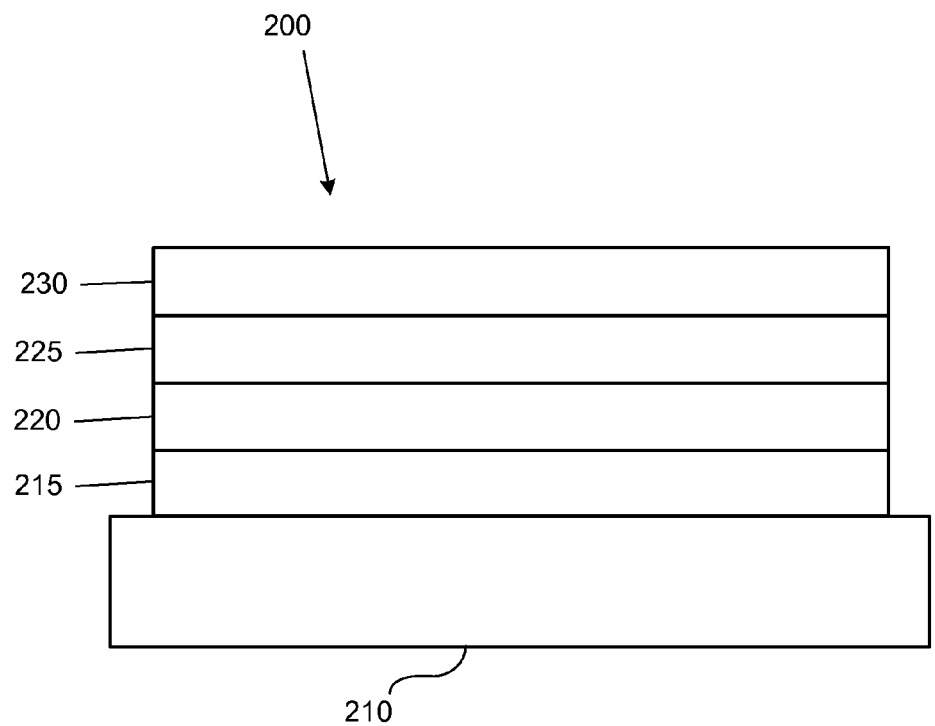
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

A device comprising series connection of OLEDs at the module level is provided. An individual OLED module may be removed from the device without causing a disruption in the flow of current. The device may comprise a bypass a switch that shunts current past the missing OLED module, causing the rest of the OLED modules in the system to continue to emit light.

It is desirable to design an organic solid state lighting system having multiple devices connected in series for several reasons. First, the dominant failure mode for OLEDs is to form an electrical short causing the current to escape from the system. Second, high voltage and low current devices work at higher power efficiency because of lower $I^2R$ losses in the current supply lines. Third, low voltage and high current devices may be particularly desirable for commercial applications. A typical OLED drive voltage is about 10V, while typical voltage sources available in most residential and commercial contexts are about 120V. Series connection of OLED modules can be used to match the voltage requirements of the first device with the voltage provided by available voltage sources.

It is also desirable to mount one or more OLEDs on a module, e.g., carrier module. An encapsulated OLED on a glass, metal or plastic substrate with no additional packaging is fragile and difficult to electrically connect to an external circuit in a robust and reversible manner. A module that carries one or more encapsulated OLEDs can incorporate rugged electrical connectors, which enable multiple modules to be incorporated in a luminaire, analogous to conventional lamps in a chandelier.

Devices with multiple OLEDs connected in series on a single substrate, or groups of parallel OLEDs in series on a single substrate, have been reported. But, these devices require complex electrode patterning schemes. Recent improvements in OLED fabrication may allow a solid state lighting module to be formed from a single OLED device per substrate, which is desirable because it leads to the simplest electroding scheme and patterning. Therefore, such devices may have a lower cost to the consumer.

The methods disclosed herein provide a device comprising multiple OLED modules, each module being on separate substrate, connected in series. The device provided has all of the advantages of an electrical series connection, including the ability to selectively unplug individual modules without causing the entire system to switch off, i.e., removal of a single OLED module from the series string does not cause the entire string to switch off. Other advantages of a device having OLED modules connected in series include the ability to replace failed modules without throwing the entire fixture into darkness, and the ability to vary the light output of the fixture by adding or removing individual modules.

Each OLED module may contain a single pixel. Modules that contain a single OLED may be connected in series into a multi-module string would be particularly applicable to under-counter lighting. Series connection for this lighting application is desirable to prevent individual OLEDs that fail short from shunting current away from the entire string. Additionally, this design raises the overall operating voltage of the string and lowers the overall current.

A first device comprising a plurality of light emitting modules is provided. Each light emitting module comprises at least one OLED and the plurality of light emitting modules are electrically connected in series. As used herein, the term "module" refers to the packaged OLED device, optical elements to enhance the light output, optional thermal management coating, control electronics and an optional power conversation circuit connected to the OLED.

Figure 3:
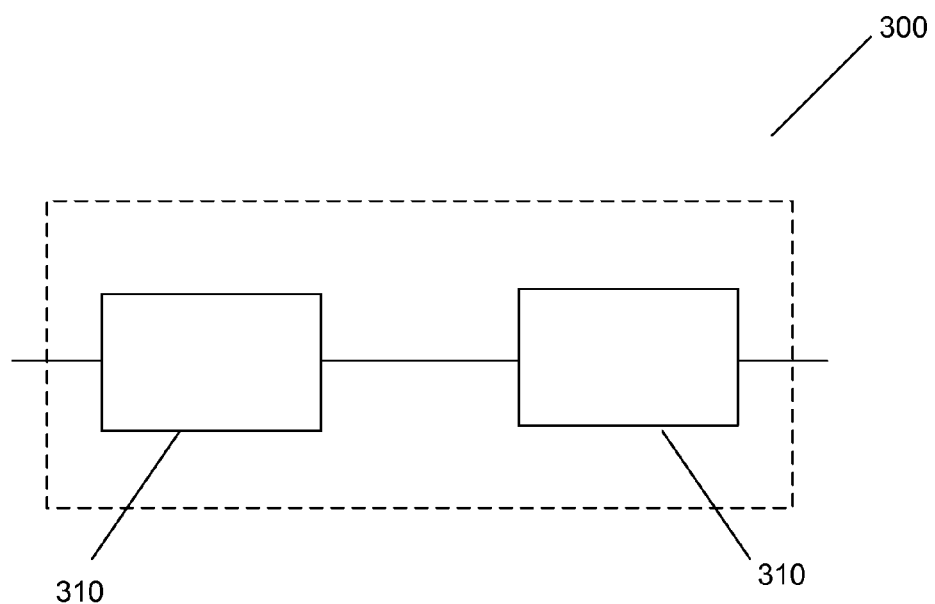
FIG. 3 shows a plurality of light emitting modules connected in series.

FIG. 3 shows a device 300 having a plurality of light emitting modules 310, and at least two light emitting modules 310 are connected in series.

As discussed above, the connecting OLED modules in series can be used to match the voltage requirements of the first device with the voltage provided by available voltage sources. For example, a first device comprising 40 OLED modules connected in series, each module having a drive voltage of 3 V, may be operated using conventional residential house mains.

In one aspect, the first device is a luminaire. Without being bound by theory, it is desirable to have series connection in a luminaire that contains multiple OLED modules, and to run the modules in series to minimize power loss. For example, a luminaire may contain 20 OLED modules, each carrying a single pixel OLED working at 6V, yielding a 120V fixture. Since OLEDs mostly fail short, the failure of a single module would result in only a 5% lumen loss. Additionally, it is desirable for the failed module to be replaced without switching off the entire luminaire because of the series connection. In this way, an individual module can be removed without darkening the entire luminaire and the consumer may easily and inexpensively replace OLED modules in the device when they fail.

In one aspect, the first device includes at least one receptacle designed to receive at least one light emitting module. The first device also includes at least one bypass switch which bypasses at least one module when the module is open circuit. In another aspect, bypass switch is mechanical. In yet another aspect, bypass switch is electrical. In a further aspect, bypass switch is a transistor circuit.

In one aspect, the first device includes at least one receptacle designed to receive at least one light emitting module. The receptacle includes a bypass switch which bypasses the receptacle when the module is unplugged. As used herein, the term "receptacle" refers to a fixture on the device including a pair of electrical contacts into which the module can be reversibly inserted, connecting the module to a power source when inserted.

Figure 4:
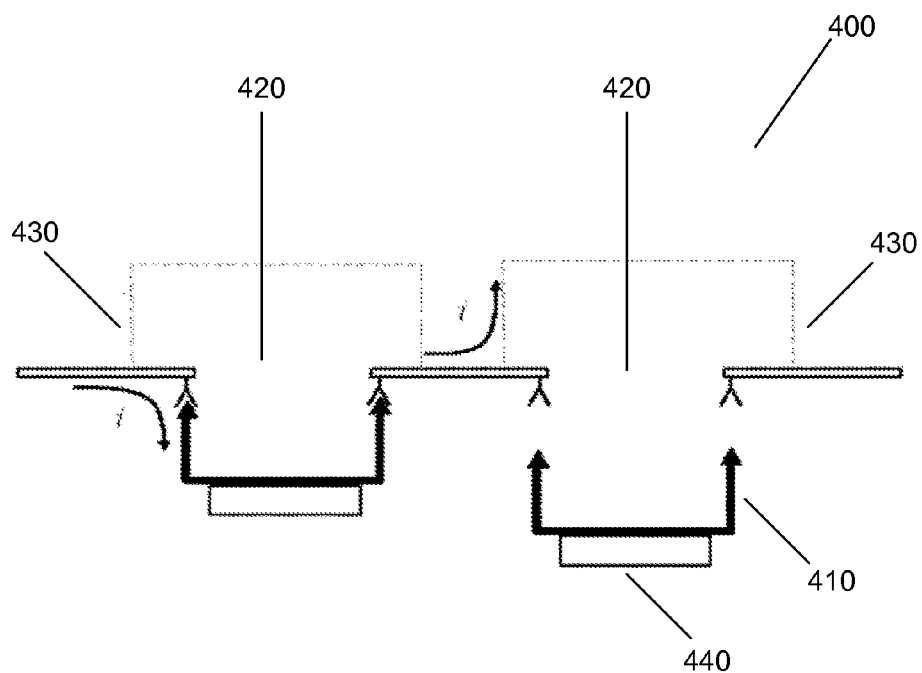
FIG. 4 shows a device that includes a receptacle designed to receive at least one light emitting module and a bypass switch which bypasses the receptacle when the module is unplugged.

FIG. 4 shows a device 400 comprising receptacles 420 that are designed to receive a light emitting module 410, which comprises an OLED 440. The receptacle 420 includes a bypass switch 430 that can bypasses the receptacle 420 when the module 410 is unplugged.

Figure 5:
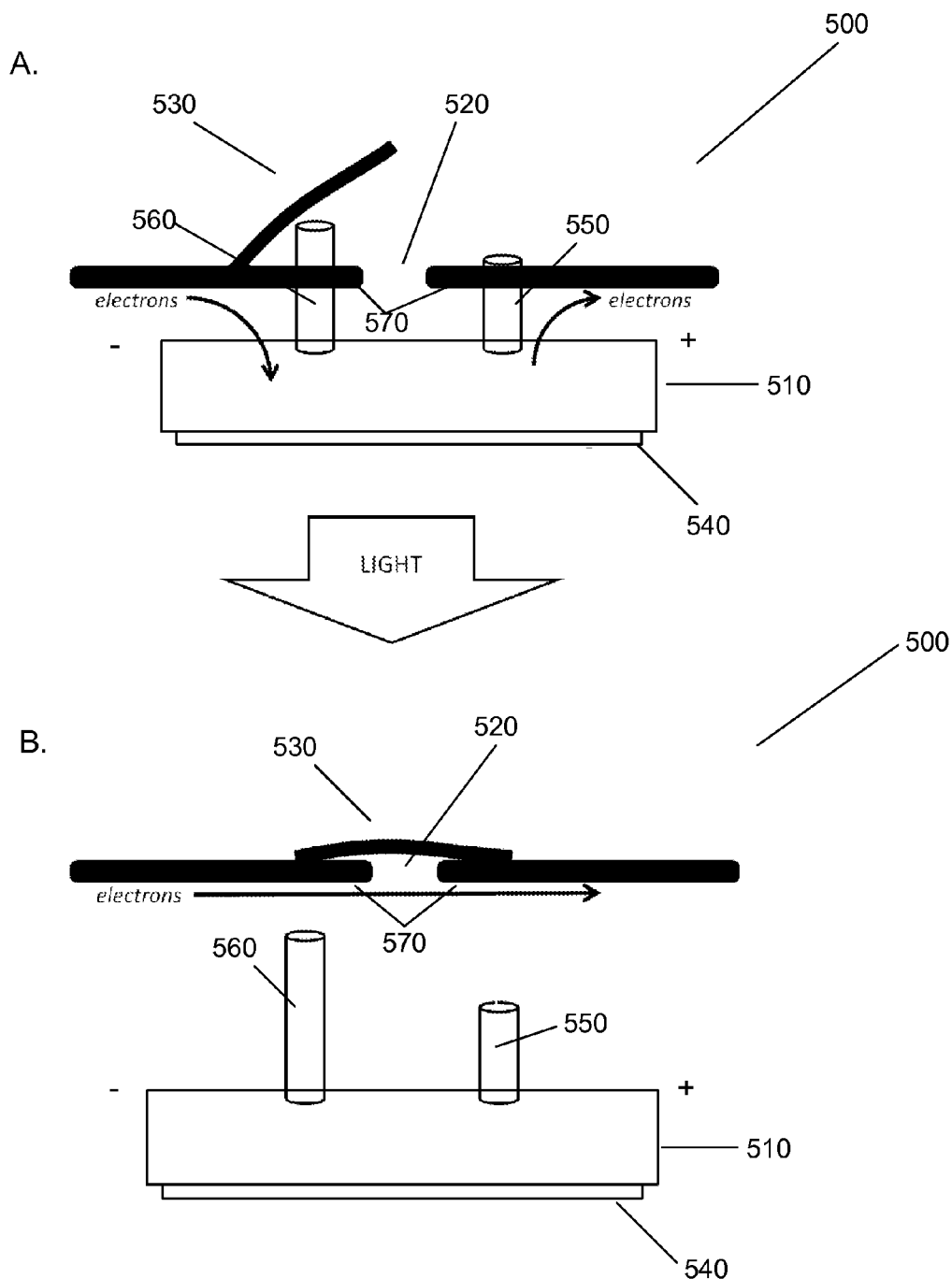
FIGS. 5A and 5B show a device with a receptacle that includes a bypass switch and a pair of electrical connectors adapted to connect to the positive contact and the negative contact of the light emitting module.

Each light emitting module may further comprise a positive contact and a negative contact and have a receptacle that includes a pair of electrical connectors adapted to electrically connect to the positive and negative contacts of one of the plurality of the light emitting modules. The bypass switch is electrically connected between the pair of electrical connectors, and the bypass switch is adapted to be open when the module is plugged into the receptacle, and to be closed when the module is unplugged. FIG. 5A shows a device 500 including a receptacle 520 that receives a light emitting module 510, which comprises a positive contact 550 and a negative contact 560. The receptacle 520 includes a bypass switch 530 and a pair of electrical connectors 570 adapted to connect to the positive contact 550 and the negative contact 560 of the light emitting module 510. The bypass switch 530 is adapted to be open when the light emitting module 510 is plugged into the receptacle 520 and to electrically connect the connectors 570 when the module is unplugged. FIG. 5B shows the same device 500 and the bypass switch 530 is closed when the light emitting module 510 is unplugged from the receptacle 520. While FIGS. 5A and 5B show only a single light emitting module 510 that can be inserted into a single receptacle 520, one light emitting module can readily be connected to another light emitting module in series via the positive and negative contacts. In addition, a device may comprise multiple receptacles that enable multiple modules to be connected in series.

As used herein, the term "contact" and "electrical connector" are used in a generic sense to describe any structure that achieves the desired electrical conduct path.

Figure 6:
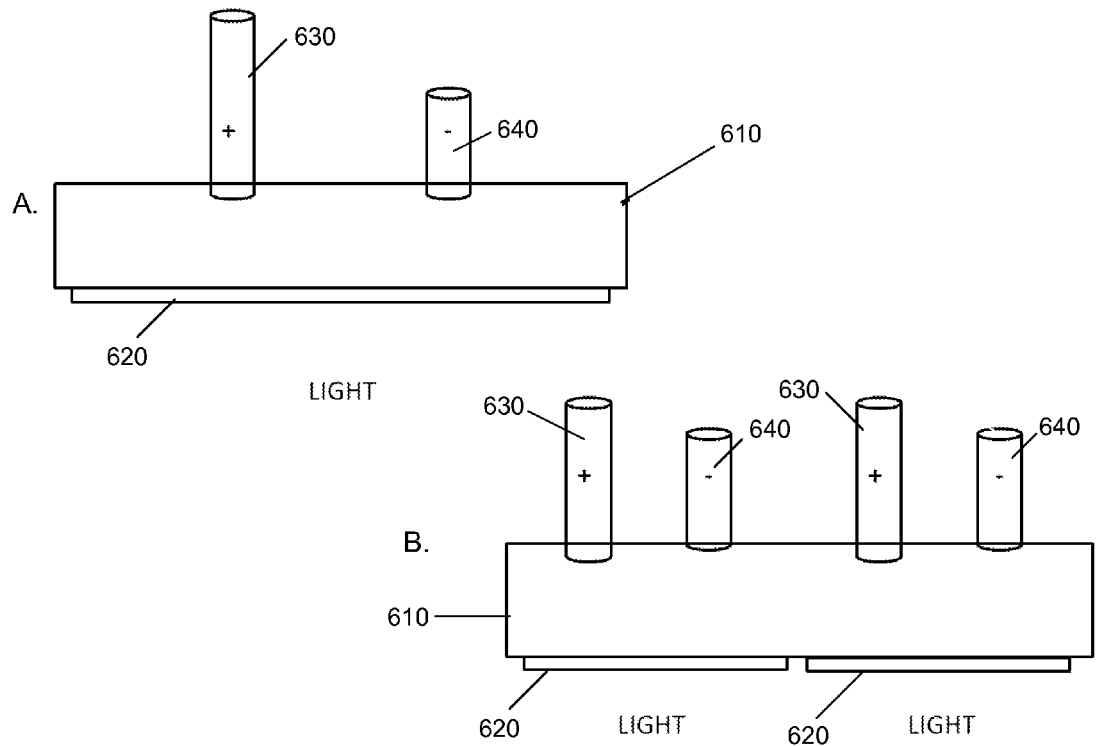
FIG. 6A shows a light emitting module comprising exactly one OLED and one pair of electrical connectors.
FIG. 6B shows a light emitting module comprising a plurality of OLEDs and a plurality of electrical connectors.

There can be more than one positive contact and one negative contact per module. Additionally, there can be more than one pair of electrical connectors per module. Preferably, the device comprises one positive and negative contact per module and one pair of electrical connectors per module. FIG. 6A shows a light emitting module 610 comprising exactly one OLED 620 and one positive contact 630 and one negative contact 640. FIG. 6B shows a light emitting module 610 comprising two OLEDs 620 and two positive contacts 630 and two negative contacts 640.

As used herein, the term "plugged into" refers to a module that is present in the receptacle and the pair of electrical connectors of the receptacle is electrically connected to the positive and negative contacts of the module. The term "unplugged" refers to a module that is not present in the receptacle and the pair of electrical connectors of the receptacle is not electrically connected to the positive and negative contacts of the module.

In one aspect, each OLED has an anode and a cathode. The positive contact is connected to at least one OLED anode, and the negative contact is connected to at least one OLED cathode.

Figure 7:
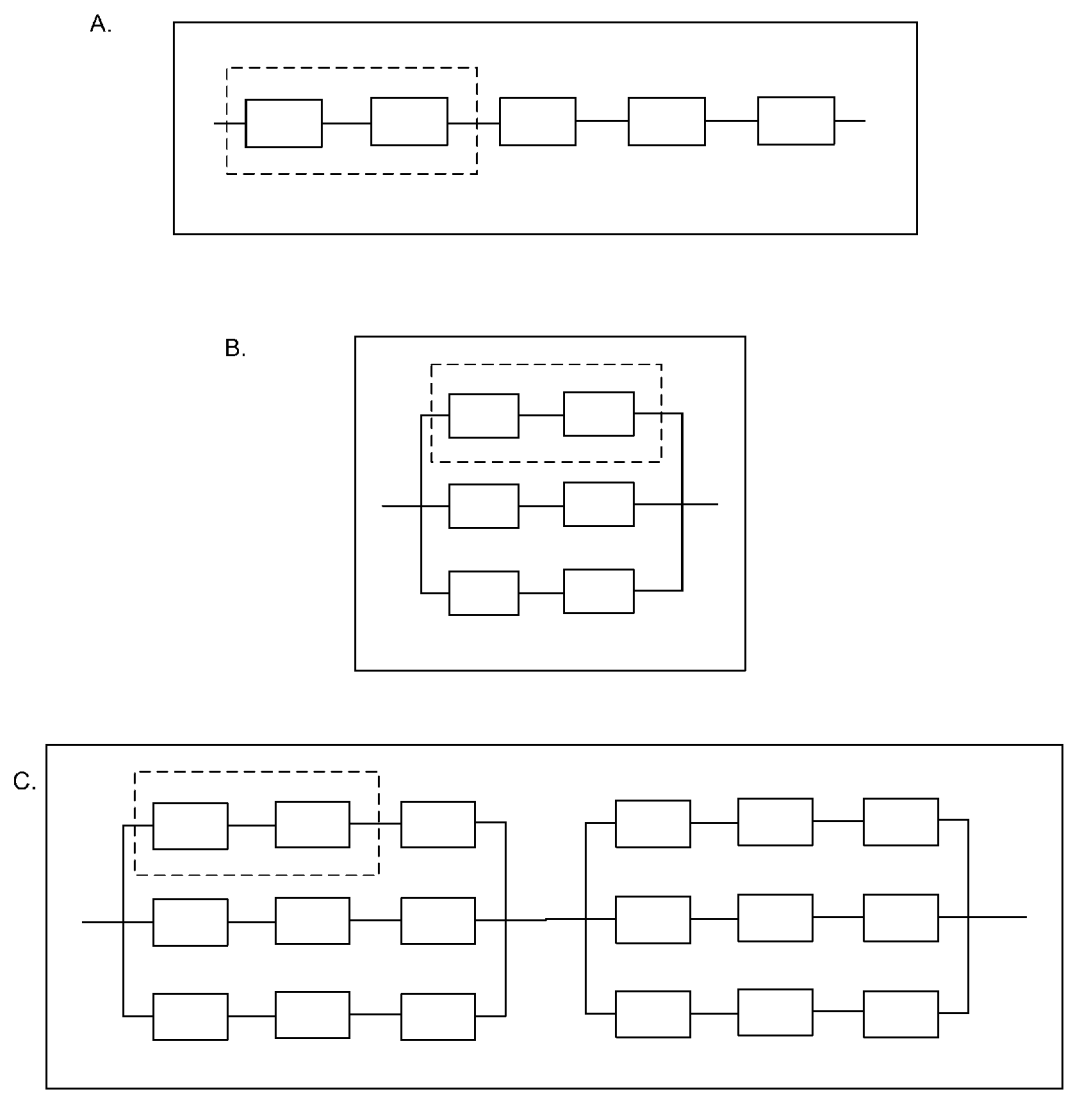
FIG. 7A shows an exemplary device in which at least one light emitting module includes a plurality of OLEDs connected in series.
FIG. 7B shows an exemplary device in which at least one light emitting module includes a plurality of OLEDs connected in parallel.
FIG. 7C shows an exemplary device in which at least one light emitting module includes a plurality of OLEDs connected in a combination of series and parallel.

In one aspect, each light emitting module includes exactly one OLED. In another aspect, each light emitting module includes a plurality of OLEDs. For devices in which each light emitting module includes a plurality of OLEDs, at least one light emitting module may include a plurality of OLEDs connected in series. Alternatively, at least one light emitting module may include a plurality of OLEDs connected in parallel. Moreover, at least one light emitting module may include a plurality of OLEDs connected in a combination of series and parallel. FIGS. 7A, 7B and 7C provide exemplary device structures illustrating these respective connections.

In one aspect, the light emitting module contains an aperture through which light can pass. In another aspect, the light emitting module is opaque.

In one aspect, the module may comprise an encapsulated OLED. As used herein, the term "encapsulated OLED" refers to an OLED on a substrate with encapsulation and leads going through the encapsulation to the outside world.

Combination with Other Materials

Materials commonly used for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limit to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and sliane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

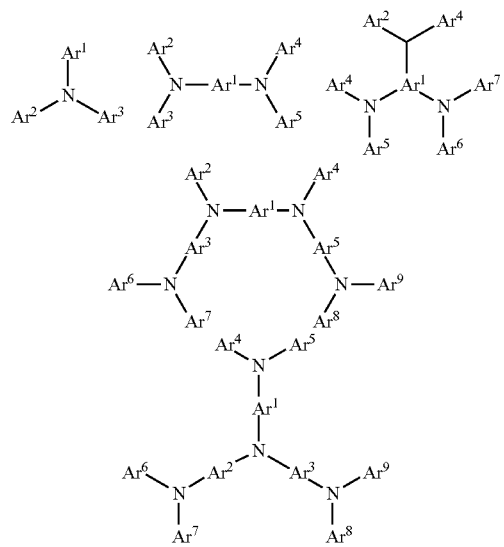

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

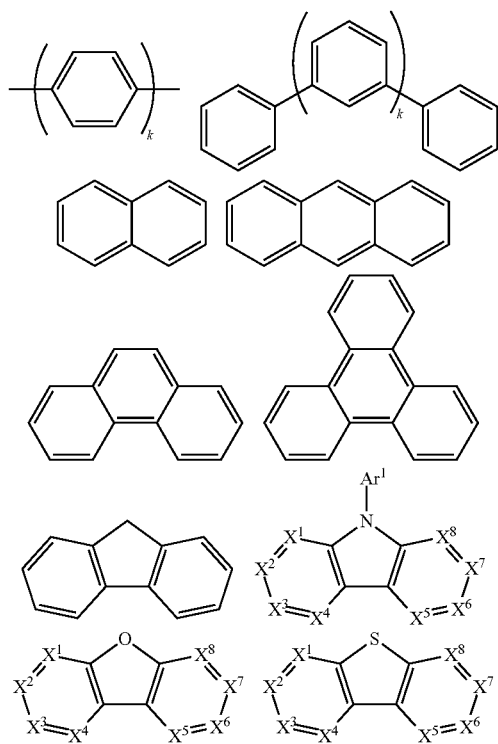

k is an integer from 1 to 20; $X^1$ to $X^8$ is C (including CH) or N; $Ar^1$ has the same group defined above.

Examples of metal complexes used in HIL or HTL include, but not limit to the following general formula:

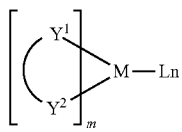

M is a metal, having an atomic weight greater than 40; $(Y^1\text{-}Y^2)$ is a bidentate ligand, $Y^1$ and $Y^2$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, $(Y^1\text{-}Y^2)$ is a 2-phenylpyridine derivative.

In another aspect, $(Y^1\text{-}Y^2)$ is a carbene ligand.

In another aspect, M is selected from Ir, Pt, Os, and Zn.

In a further aspect, the metal complex has a smallest oxidation potential in solution vs. $Fc^+/Fc$ couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant.

Examples of metal complexes used as host are preferred to have the following general formula:

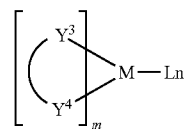

M is a metal; $(Y^3\text{-}Y^4)$ is a bidentate ligand, $Y^3$ and $Y^4$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, the metal complexes are:

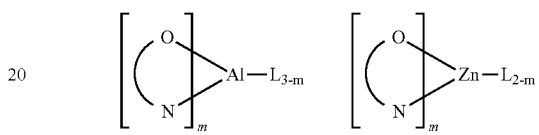

(O—N) is a bidentate ligand, having metal coordinated to atoms O and N.

In another aspect, M is selected from Ir and Pt.

In a further aspect, $(Y^3\text{-}Y^4)$ is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, host compound contains at least one of the following groups in the molecule:

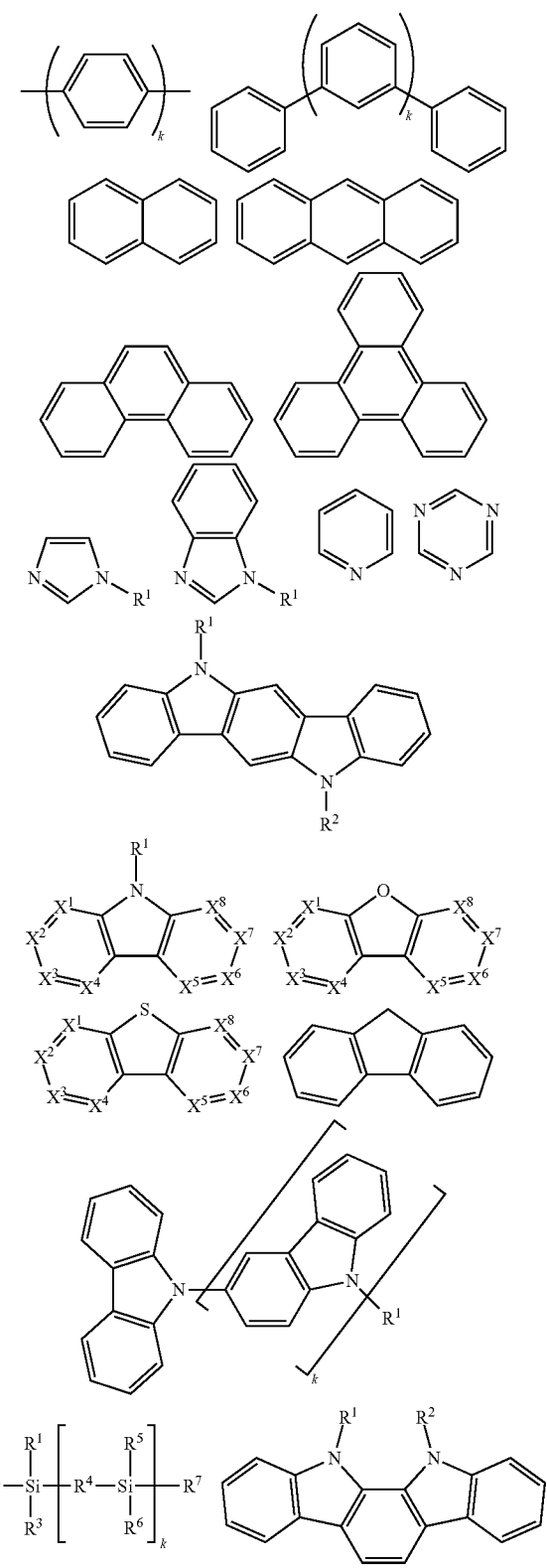

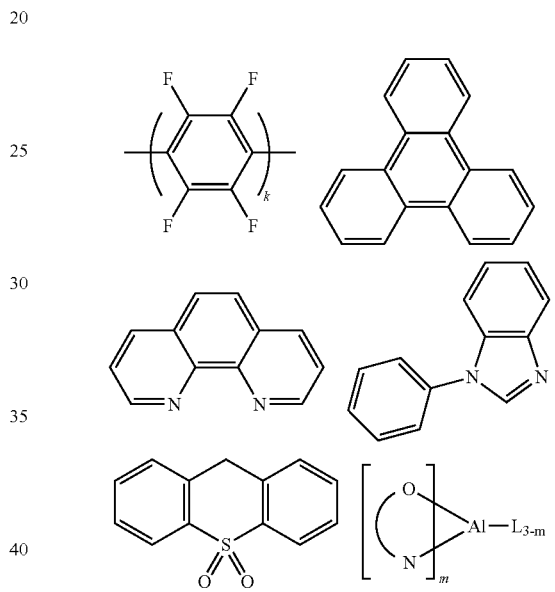

R[1] to R[7] is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above.

k is an integer from 0 to 20.

X[1] to X[8] is selected from C (including CH) or N.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule used as host described above.

In another aspect, compound used in HBL contains at least one of the following groups in the molecule:

k is an integer from 0 to 20; L is an ancillary ligand, m is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

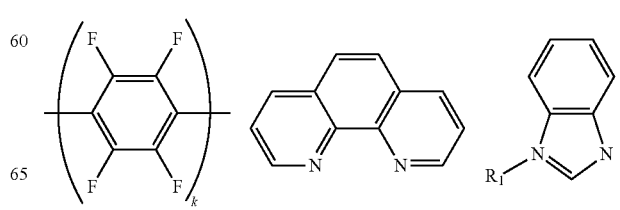

-continued

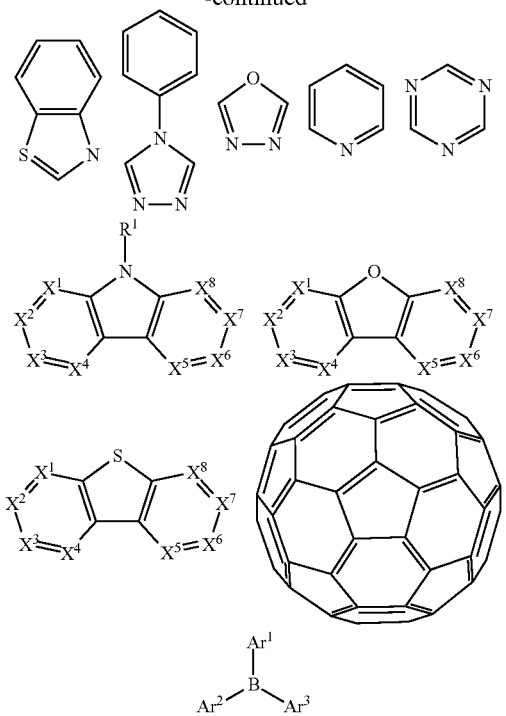

$R^1$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above.

$Ar^1$ to $Ar^3$ has the similar definition as Ar's mentioned above.

k is an integer from 0 to 20.

$X^1$ to $X^8$ is selected from C (including CH) or N.

In another aspect, the metal complexes used in ETL contains, but not limit to the following general formula:

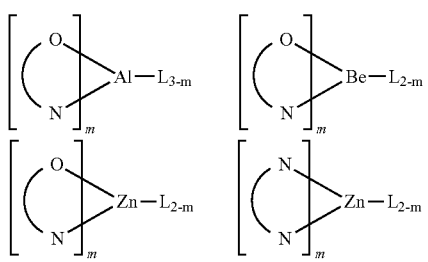

(O—N) or (N—N) is a bidentate ligand, having metal coordinated to atoms O, N or N, N; L is an ancillary ligand; m is an integer value from 1 to the maximum number of ligands that may be attached to the metal.

In any above-mentioned compounds used in each layer of the OLED device, the hydrogen atoms can be partially or fully deuterated.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table 2 of U.S. patent application Ser. No. 13/043,180, filed Mar. 8, 2011, the disclosure of which is herein expressly incorporated by reference in its entirety.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A first device comprising:
   a plurality of light emitting modules, wherein each light emitting module comprises:
      a plurality of positive contacts;
      a plurality of negative contacts; and
      at least one OLED; and
   a plurality of receptacles electrically connected in series and designed to receive the plurality of light emitting modules,
   wherein each receptacle includes a plurality of electrical connectors adapted to electrically connect to the positive and negative contacts of one of the plurality of the light emitting modules; and
   wherein a total number of light emitting modules can be selected based upon a supply voltage to the device and a desired illumination level.

2. The first device of claim 1, wherein the device is a luminaire.

3. The first device of claim 1, wherein the device includes at least one bypass switch which bypasses at least one module when the module is open circuit.

4. The first device of claim 1, wherein each receptacle includes a bypass switch which bypasses the receptacle when the module is unplugged from the receptacle.

5. The first device of claim 4,
   wherein the bypass switch is electrically connected between a pair of the electrical connectors; and
   the bypass switch is adapted to be open when the module is plugged into the receptacle, and to be closed when the module is unplugged from the receptacle.

6. The first device of claim 5, wherein:
   each OLED has an anode and a cathode;
   each positive contact is connected to at least one OLED anode; and
   each negative contact is connected to at least one OLED cathode.

7. The first device of claim 4, wherein the bypass switch is mechanical.

8. The first device of claim 4, wherein the bypass switch is electrical.

9. The first device of claim 4, wherein the bypass switch is a transistor circuit.

10. The first device of claim 1, wherein each light emitting module includes a plurality of OLEDs.

11. The first device of claim 1, wherein the light emitting module contains an aperture through which light can pass.

12. The first device of claim 1, wherein the light emitting module is opaque.

13. The first device of claim 10, wherein at least one light emitting module includes a plurality of OLEDs connected in series.

14. The first device of claim 10, wherein at least one light emitting module includes a plurality of OLEDs connected in parallel.

15. The first device of claim 10, wherein at least one light emitting module includes a plurality of OLEDs connected in a combination of series and parallel.

16. The first device of claim 1, wherein the light emitting module comprises at least one encapsulated OLED.

17. The first device of claim 1, wherein each of the plurality of modules is on a separate substrate from each other of the plurality of modules.

18. The first device of claim 1, wherein at least one OLED comprises a single pixel.

* * * * *